United States Patent

Ostrem et al.

Patent Number: 5,416,278
Date of Patent: May 16, 1995

[54] FEEDTHROUGH VIA CONNECTION

[75] Inventors: Fred E. Ostrem, Long Grove; Alfred G. Ocken, Palatine, both of Ill.

[73] Assignee: Motorola, Inc., Schaumburg, Ill.

[21] Appl. No.: 24,046

[22] Filed: Mar. 1, 1993

[51] Int. Cl.$^6$ ............................................. H05K 1/02
[52] U.S. Cl. ..................................... 174/263; 174/261
[58] Field of Search ............... 174/263, 262, 255, 254, 174/250, 262; 361/748; 29/830, 842

[56] References Cited

U.S. PATENT DOCUMENTS

| | | | |
|---|---|---|---|
| 3,844,831 | 10/1974 | Cass et al. | 117/212 |
| 3,888,639 | 6/1975 | Hastings et al. | 29/626 |
| 5,079,065 | 1/1992 | Masakazu et al. | 428/137 |

Primary Examiner—Leo P. Picard
Assistant Examiner—L. Thomas
Attorney, Agent, or Firm—Nicholas C. Hopman

[57] ABSTRACT

A method for constructing a feedthrough via connection and a corresponding apparatus includes a metallic plate (101), or rigidizer, preferably composed of an aluminum material. A solderable contact area (103), is located on the plate (101). This contact area (103) is preferable comprised of a copper material selectively disposed by a plasma spraying process. Next, an electrically insulating adhesive layer (105) is disposed onto the plate (101). This adhesive layer (105) has a feedthrough via (106) disposed therethrough aligned with the contact area (103). Then, a substrate (109), preferably composed of a flexible composite polyimide material, is disposed onto the adhesive layer (105). This flexible substrate (109) has a via (110) disposed therethrough with a solderable area (111) disposed thereon. Then, a quantity of solder (113) is disposed onto the solderable area (111), and the assembly (100) is heated so that the solder (113) flows into the vias (106) and (110), thereby providing an electrical connection including the solderable area (111) of the via (110), the solder (113), and the contact area (103). During this reflow step, the structure of the adhesive layer (105) acts as a soldermask preventing the solder (113) from flowing outside of an area defined by the via (106).

12 Claims, 1 Drawing Sheet

FEEDTHROUGH VIA CONNECTION

FIELD OF THE INVENTION

The present invention relates to electronic module assemblies, and particularly to the type of module assembly that includes a substrate both electrically and mechanically connected to a heatsink.

BACKGROUND OF THE INVENTION

In the field of packaging of electronic components onto a substrate, it is frequently desirable to provide an electrical connection between some of these components and a heatsink. This may be to facilitate the conduction of a significant current, or for using the heatsink as an electromagnetic interference shield. Typically, the components are mounted onto a substrate that is disposed onto the heatsink. Prior art schemes have been devised to electrically connect the pertinent electrical components located on the substrate and the heatsink.

One scheme relies on electrically connecting certain electrical components located on the substrate with the heatsink using aluminum wire bonds. This requires the disposal of a bonding pad onto the substrate. Then an aluminum wire is ultrasonically bonded between the heatsink and the bonding pad. This connection scheme is undesirably expensive and difficult to manufacture. Also, it has undesirable electrical performance because of the wire bond's electrical performance at high frequencies. Further, it is unreliable in applications with a severe vibration environment. Another prior art scheme applies a metal post inserted into a metal baseplate and extending through a solderable feedthrough via in a substrate. In this scheme it is difficult to reliably solder the pin to the solderable via, is costly because of a separate post, and is generally difficult to manufacture.

A connection approach that is reliable, easily assembled, and less expensive is dearly needed.

DETAILED DESCRIPTION OF A PREFERRED EMBODIMENT

Figure 1:
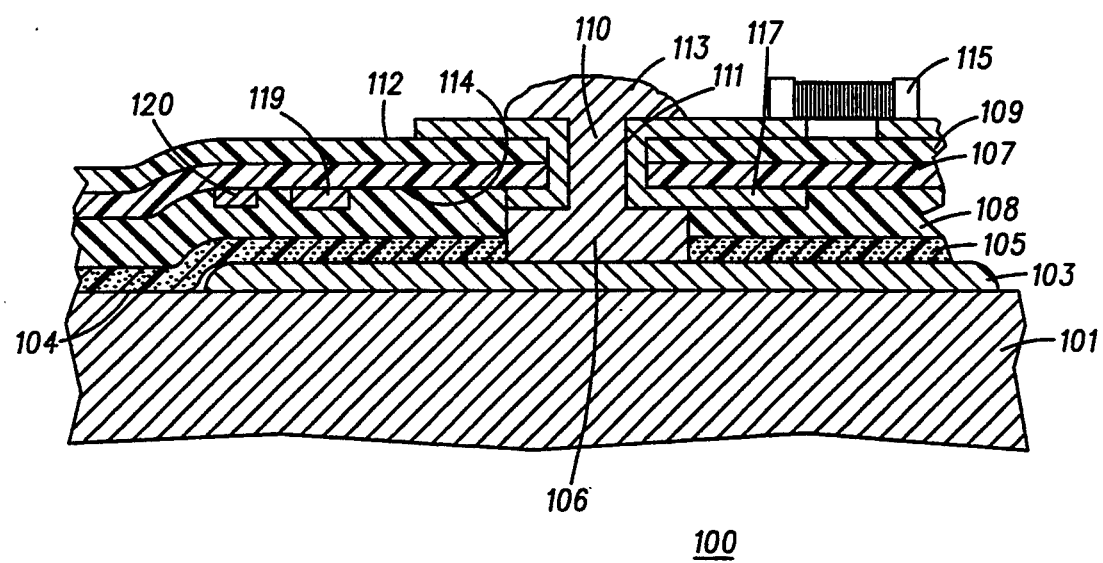
FIG. 1 is a cross-sectional diagram of an improved structure, in accordance with the invention.

In FIG. 1 a cross-sectional diagram of a circuit substrate disposed onto an aluminum substrate is shown. An assembly method to manufacture this structure will be detailed as follows. This assembly includes a metallic plate, or rigidizer, 101. This plate 101, may be used as a heatsink. In this case, an aluminum material is used. Of course any other electrically conductive, heat spreading material, may be substituted for the aluminum if desired. Preferably, the aluminum plate 101 is substantially planar.

A copper layer, or other solderable metal, is disposed onto a top surface 104 of the aluminum plate 101, confined to selective areas, forming solderable contact areas 103. These selective areas 103 represent areas that will be used to facilitate an electrical connection. This copper layer may either be plasma sprayed, or deposited onto the aluminum plate 101 using another technique. Those skilled in the art will recognize other materials and application process such as electroplated tin, plasma sprayed tin, electroplated silver, plasma sprayed silver, plasma sprayed nickel, and electroless nickel, that may be substituted for the copper material and plasma spraying process in this step. A plasma sprayed deposition process is a standard commercial process. With the use of a mask, or stencil, various patterns, of predetermined sizes, may be deposited onto the aluminum plate 101. This deposition step is necessary when using an aluminum plate because aluminum is not practically solderable. Alternatively, if the plate 101 is composed of a solderable material, such as copper, this separate deposition step may not be necessary. In this case the plate 101 and the solderable contact areas 103 would be both be comprised of copper.

Next, an electrically insulating adhesive layer 105 is applied to the aluminum plate 101. This adhesive layer 105 preferably is composed of an acrylic or silicone based material. It is applied to the copper free areas on a top surface 104 of the aluminum plate 101 and portions of the solderable contact areas 103. When using a pressure sensitive adhesive for layer 105 a sheet is first blanked with holes, or feedthrough vias, 106 corresponding to the position of the solderable contact areas 103. Note that only one such via is shown in FIG. 1. These feedthrough vias are sized smaller than the solderable contact areas 103 to effectively captivate solder to be applied later. This electrically insulating adhesive layer 105 is then disposed onto the aluminum plate 101. The feedthrough vias 106 are positioned aligned with and exposing the corresponding solderable contact areas 103. The feedthrough vias 106 allow the passage of solder 113 to the solderable contact areas 103. This adhesive layer 105 has several functions. These include provision of an electrically insulating dielectric barrier between the aluminum plate 101 and a to be provided circuit substrate, an adhesive function to bond the selectively exposed aluminum plate 101 and the to be provided circuit substrate, and a structure to mask the flow of the solder material 113 to be applied later. Without the structure to mask limit the flow of the solder 113, it would flow unrestricted outside the solderable contact areas 103, potentially lifting off the circuit substrate to be applied later. Because of the construction of this electrically insulating adhesive layer 105 and the corresponding feedthrough vias the to be applied solder will be captivated within the feedthrough vias 106.

Next, a flexible circuit substrate 107, 108 and 109, in this case composed of a composite polyimide material, is disposed onto the adhesive layer 105. Those skilled in the art will recognize that a rigid substrate may also be used in place of the flexible substrate. Element 107 corresponds to a bottom layer of the composite polyimide substrate and element 109 corresponds to a top layer of the composite polyimide substrate. Element 108 is an optional coverlay attached to the bottom layer 107 to add additional electrical isolation between a multiplicity of separated conductive traces 119 120 and the aluminum plate 101. This additional isolation may not be required in all cases. This flexible substrate, comprised of layers 107, 108, and 109, is fabricated separately and is typically joined by a pressure sensitive adhesive. The flexible substrate 107, 108, and 109 also has via 110 disposed therethrough extending from a first side 112 to a second side 114. This via 110 is positioned aligned with the corresponding feedthrough via 106 and the solderable contact area 103. Optionally, if the coverlay layer 108 is attached, then the via 110 also extends through the coverlay layer 108. Further, via 110 has a solderable area 111 disposed thereon extending from the first side 112 to the second side 114 of the substrate extending to a conductive trace 117. If the coverlay layer 108 is present, then the solderable area 111 does not extend through the coverlay's via.

Next, solder 113, typically in the form of a solder paste —the quantity being sufficient to fill the vias 106 and 110, is disposed on top of the solderable area 111, along with electrical components represented by reference number 115.

Next, the complete assembly 100 is heated in a reflow oven such that the solder 113 flows into the vias 106 and 110, thereby providing an electrical connection including the solderable area 111, the solder 113, and the solderable contact areas 103. During this reflow step, the structure of the adhesive layer 105, prevents the solder 113 from flowing outside of an area defined by the via 106.

This new structure has many advantages over prior art connection schemes. For instance, it provides a more reliable connection than an aluminum wirebond. Also, its performance in a hostile vibration environment is clearly superior because of the solid nature of its structure. Further, a soldering process is easier to control than a wire bonding process, and the resulting structure is more permanent and robust. This approach also provides a better high frequency electrical connection, has a lower manufacturing cost and is easy to assemble. Also, the coverlay 108 and/or the electrically insulating adhesive layer 105 electrically isolate traces 119 and 120 from the aluminum plate 101.

Although a particular assembly is shown in the preferred embodiment, other laminated structures may take advantage of this new approach. For example these may include connector assemblies.

What is claimed is:

1. A feedthrough via connection apparatus comprising:
   a metallic plate having a solderable contact area;
   an electrically insulating adhesive layer disposed onto said metallic plate, said electrically insulating adhesive layer having a feedthrough via disposed therethrough, the feedthrough via positioned aligned with and exposing the solderable contact area of said metallic plate;
   a substrate having a solderable via disposed therethrough extending from a first side to a second side, said substrate disposed onto said electrically insulating adhesive layer, wherein the solderable via is positioned aligned with the solderable contact area of said metallic plate, and wherein said electrically insulating adhesive layer bonds said substrate to said metallic plate; and
   solder disposed extending from the solderable via, captivated within the feedthrough via of said electrically insulating adhesive layer, and extending to the solderable contact area of said metallic plate, thereby electrically connecting the solderable via of said substrate to the solderable contact area of said metallic plate.

2. An apparatus in accordance with claim 1 wherein said substrate has a multiplicity of separated conductive traces disposed on at least the second side, said multiplicity of separated conductive traces electrically isolated from said metallic plate by said electrically insulating adhesive layer.

3. An apparatus in accordance with claim 1 wherein said solder comprises reflowed solder paste.

4. An apparatus in accordance with claim 1 wherein said substrate comprises a flexible substrate.

5. A feedthrough via connection apparatus comprising:
   a substantially planar aluminum rigidizer having a top surface;
   a plasma sprayed copper layer selectively disposed onto the top surface of said substantially planar aluminum rigidizer forming a contact area having a predetermined size;
   an electrically insulating adhesive layer disposed onto the top surface of said substantially planar aluminum rigidizer, wherein said electrically insulating adhesive layer has a feedthrough via disposed therethrough, said feedthrough via having a predetermined size smaller than the predetermined size of the contact area of the selectively disposed plasma sprayed copper layer, said feedthrough via positioned aligned with and outwardly exposing a portion of the contact area of said plasma sprayed copper layer;
   an electrically insulating coverlay disposed onto said electrically insulating adhesive layer, said electrically insulating coverlay having a second feedthrough via disposed therethrough positioned aligned with the feedthrough via of said electrically insulating adhesive layer;
   a substrate disposed onto said electrically insulating coverlay, said substrate having a via disposed therethrough extending from a first side to a second side, said via having a solderable area disposed thereon extending from the first side of said substrate, along a surface of the via, to the second side of said substrate, and wherein the via is positioned aligned with the contact area of said plasma sprayed copper layer; and
   solder disposed into the solderable via of said substrate, extending through the second feedthrough via of said electrically insulating coverlay, contained within the feedthrough via of said electrically insulating adhesive layer and extending to the contact area of the selectively disposed plasma sprayed copper layer, thereby electrically connecting the solderable via of said substrate to the contact area of the selectively disposed plasma sprayed copper layer of said substantially planar aluminum rigidizer.

6. An apparatus in accordance with claim 5 wherein said two sided substrate has a multiplicity of separated conductive traces disposed on at least the second side which is electrically isolated from said substantially planar aluminum rigidizer by said electrically insulating coverlay.

7. An apparatus in accordance with claim 6 wherein said solder comprises reflowed solder paste.

8. An apparatus in accordance with claim 7 wherein said substrate comprises a flexible substrate.

9. A feedthrough via connection apparatus comprising:
   a solder-resistant metallic plate including a major surface and a surface opposing the major surface, the solder-resistant metallic plate having a solderable contact area disposed thereon, and wherein an electrical circuit path is formed between the solderable contact area and the opposing major surface;
   an electrically insulating adhesive layer disposed onto said metallic plate, said electrically insulating adhesive layer having a feedthrough via disposed therethrough, the feedthrough via positioned aligned with and exposing the solderable contact area of said metallic plate;

a substrate having a solderable via disposed therethrough extending from a first side to a second side, said substrate disposed onto said electrically insulating adhesive layer, wherein the solderable via is positioned aligned with the solderable contact area of said metallic plate, and wherein said electrically insulating adhesive layer bonds said substrate to said metallic plate; and solder disposed extending from the solderable via, captivated within the feedthrough via of said electrically insulating adhesive layer, and extending to the solderable contact area of said metallic plate, thereby electrically connecting the solderable via of said substrate to the solderable contact area of said metallic plate.

10. An apparatus in accordance with claim 9 wherein said substrate has a multiplicity of separated conductive traces disposed on at least the second side, said multiplicity of separated conductive traces electrically isolated from said metallic plate by said electrically insulating adhesive layer.

11. An apparatus in accordance with claim 10 wherein said substrate comprises a flexible substrate.

12. A feedthrough via connection apparatus comprising:

a metallic plate having a solderable contact area disposed thereon;

an electrically insulating adhesive layer disposed onto said metallic plate, said electrically insulating adhesive layer having a feedthrough via disposed therethrough, the feedthrough via positioned aligned with and exposing the solderable contact area of said metallic plate;

a substrate having a solderable via disposed therethrough having a diameter smaller than a diameter of the feedthrough via of the electrically insulating adhesive layer, the solderable via extending from a first side to a second side, said substrate disposed onto said electrically insulating adhesive layer, wherein the solderable via is positioned aligned with the solderable contact area of said metallic plate, and wherein said electrically insulating adhesive layer bonds said substrate to said metallic plate; and solder disposed extending from the solderable via, captivated within the feedthrough via of said electrically insulating adhesive layer, and extending to the solderable contact area of said metallic plate, thereby electrically connecting the solderable via of said substrate to the solderable contact area of said metallic plate.

* * * * *